US008872416B2

(12) United States Patent
You

(10) Patent No.: US 8,872,416 B2
(45) Date of Patent: Oct. 28, 2014

(54) DISPLAY DEVICE AND MANUFACTURING METHOD OF THE SAME

(71) Applicant: Samsung Display Co., Ltd., Yongin (KR)

(72) Inventor: Jin-Young You, Yongin (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 0 days.

(21) Appl. No.: 13/864,704

(22) Filed: Apr. 17, 2013

(65) Prior Publication Data
US 2014/0132150 A1   May 15, 2014

(30) Foreign Application Priority Data

Nov. 14, 2012  (KR) .......................... 10-2012-0128886

(51) Int. Cl.
*H05B 33/02* (2006.01)
*H01L 51/50* (2006.01)
*F21V 7/00* (2006.01)
*H05B 33/10* (2006.01)

(52) U.S. Cl.
CPC . *F21V 7/00* (2013.01); *H05B 33/10* (2013.01)
USPC ....... 313/113; 313/504; 313/489; 362/296.01

(58) Field of Classification Search
CPC . H01L 33/56; H01L 2224/8592; H01L 33/44; H01L 51/5246; H01L 51/5271; H01L 51/5281; H01L 33/46; H01L 33/60; H01L 51/524; H01L 51/5262; H01J 61/025; H01J 61/86; H01K 1/325; H01K 7/02; H01K 1/26
USPC .................................................. 313/498–512
See application file for complete search history.

(56) References Cited

U.S. PATENT DOCUMENTS 6,259,496 B1 *  7/2001  Kashima ........................ 349/62
2007/0053205 A1 *  3/2007  Jang et al. ..................... 362/609
2012/0049206 A1 *  3/2012  Choi et al. ....................... 257/88

FOREIGN PATENT DOCUMENTS

KR  10-2003-0096029 A  12/2003
KR  10-2012-0075272 A   7/2012

* cited by examiner

*Primary Examiner* — Donald Raleigh
(74) *Attorney, Agent, or Firm* — Robert E. Bushnell, Esq.

(57) ABSTRACT

A display device according to an exemplary embodiment of the present invention includes a display panel displaying an image, a window positioned on the display panel and protecting the display panel, and a protection film attached under the display panel and reflecting light transmitted from the outside. The protection film may comprise a first base layer, a metal layer positioned on the first base layer, and, optionally, a second base layer formed on the metal layer. The base layers may be formed of an organic polymer, and the metal layer may be formed of a metal that imparts light reflectivity. A method for manufacturing such a display device is also presented.

12 Claims, 7 Drawing Sheets

DISPLAY DEVICE AND MANUFACTURING METHOD OF THE SAME

CLAIM OF PRIORITY

This application makes reference to, incorporates the same herein, and claims all benefits accruing under 35 U.S.C. §119 from an application for DISPLAY DEVICE AND MANUFACTURING METHOD OF THE SAME, earlier filed in the Korean Intellectual Property Office on Nov. 14, 2012 and there duly assigned Serial No. 10-2012-0128886.

BACKGROUND OF THE INVENTION

1. Field of the Invention

The present invention relates to a display device and a manufacturing method of a display device.

2. Description of the Related Art

Currently popular display devices include a liquid crystal display (LCD), a plasma display device (PDP), an organic light emitting display (OLED), a field effect display (FED), and an electrophoretic display (EPD).

Particularly, the organic light emitting diode (OLED) display includes a plurality of OLEDs formed of a hole injection electrode, an organic emission layer, and an electron injection electrode. Each organic light emitting diode emits light when excitons, which are generated as electrons and holes are combined, drop from an excited state to a ground state and emit photons of light corresponding to the energy difference between the two energy states, and the OLED display displays an image using the light. The organic light emitting device can be used for a lighting device and as a display device for displaying predetermined images.

The organic light emitting element may be deteriorated by external factors such as external moisture, oxygen, or ultraviolet rays (UV), so packaging methods for encapsulating the organic light emitting element are important, and the organic light emitting diode (OLED) display is required to be manufactured to be either thin or flexible for various types of applications.

In order to encapsulate the organic light emitting element and form a thin organic light emitting diode (OLED) display that is bendable, a thin film encapsulation (TFE) method has been developed. In the thin film encapsulation method, a display area is covered with a thin film encapsulation layer by alternately stacking an inorganic layer and an organic layer over the organic light emitting elements that are formed in the display area of the display substrate. When the display substrate of the organic light emitting diode (OLED) display including the thin film encapsulation layer is formed with a flexible film, it can be easily bent, and making it slim has practical advantages.

Meanwhile, a protection film protecting a display substrate may be attached under the display substrate, and an FPCB (flexible printed circuit board) transmitting a driving signal may be attached under the protection film.

However, if the organic light emitting diode (OLED) display to which a power source is turned off is exposed to strong natural light (for example sunlight), a lower portion of the display substrate is entirely exposed to view such that an adhesion state of the FPCB with the display panel (for example, wrinkled the FPCB) is revealed.

The above information disclosed in this Background section is only for enhancement of understanding of the background of the invention and therefore it may contain information that does not form the prior art that is already known to a person of ordinary skill in the art.

SUMMARY OF THE INVENTION

The present invention provides a display device reflecting external light transmitted to a rear surface of a display panel.

Also, the present invention provides a manufacturing method of a display device reflecting external light transmitted to a rear surface of a display panel.

A display device according to an exemplary embodiment of the present invention includes a display panel displaying an image, a window positioned on the display panel and protecting the display panel, and a protection film attached under the display panel and reflecting light transmitted from the outside.

The protection film may include a first base layer and a metal layer positioned on the first base layer.

The metal layer may include one of aluminum, silver, chromium, and molybdenum.

The first base layer may include one of polyethylene terephthalate, polyethylene naphthalate, polyethylene sulfide, polyethylene, urethane, and polycarbonate.

A second base layer formed on the metal layer may be further included.

At least one adhesion layer formed within at least one of the interface between the first base layer and the metal layer and the interface between the metal layer and the second base layer may be further included.

A thickness of the adhesion layer may be in a range of 4 μm-5 μm.

Reflectivity of the protection film may be in a range of 6%-10%.

Phototransmittance of the protection film may be in a range of 50%-80%.

A manufacturing method of a display device according to an exemplary embodiment of the present invention includes: forming a display panel including a display substrate, an organic light emitting element formed on the display substrate, and a thin film encapsulation layer covering the organic light emitting element; attaching a window protecting the display panel on the display panel; and attaching a protection film reflecting light transmitted from the outside under the display panel.

The protection film may include a first base layer of a poly(ethylene terephthalate) (PET) material and a metal layer positioned on the first base layer.

The metal layer may be formed by depositing a metal on the first base layer.

The metal layer may be formed of one of aluminum, silver, chromium, and molybdenum.

Reflectivity of the protection film may be in a range of 6%-10%.

According to an exemplary embodiment of the present invention, when a display device that is in an off state is exposed to strong sunlight, the display device reflects light transmitted from the outside, thereby preventing the inside of the display device from being exposed to view.

Also, a manufacturing method of a display device according to another exemplary embodiment of the present invention may manufacture the display device in such a way as to prevent the inside of the display device from being exposed to view.

BRIEF DESCRIPTION OF THE DRAWINGS

A more complete appreciation of the invention and many of the attendant advantages thereof will be readily apparent as the same becomes better understood by reference to the following detailed description when considered in conjunction with the accompanying drawings, in which like reference symbols indicate the same or similar components, wherein.

DETAILED DESCRIPTION OF THE EMBODIMENTS

Figure 1:
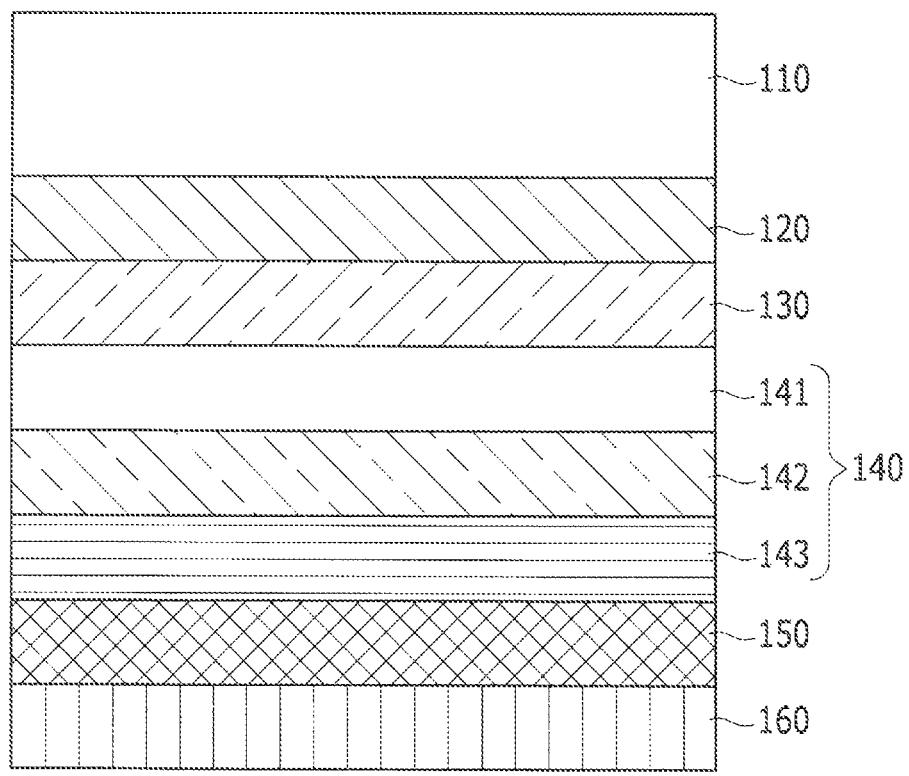
FIG. 1 is a cross-sectional view of a display device according to the first exemplary embodiment of the present invention.

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention. The drawings and description are to be regarded as illustrative in nature and not restrictive. Like reference numerals designate like elements throughout the specification.

Further, since sizes and thicknesses of constituent members shown in the accompanying drawings are arbitrarily given for better understanding and ease of description, the present invention is not limited to the illustrated sizes and thicknesses.

In the drawings, the thickness of layers, films, panels, regions, etc., are exaggerated for clarity. In the drawings, for better understanding and ease of description, the thicknesses of some layers and areas are exaggerated. It will be understood that when an element such as a layer, film, region, or substrate is referred to as being "on" another element, it can be directly on the other element, or intervening elements may also be present.

In addition, unless explicitly described to the contrary, the word "comprise" and variations such as "comprises" or "comprising" will be understood to imply the inclusion of stated elements but not the exclusion of any other elements. Further, in the specification, an upper part of a target portion indicates an upper part or a lower part of the target portion, and it does not mean that the target portion is always positioned at the upper side based on a gravity direction.

FIG. 1 is a cross-sectional view of a display device according to the first exemplary embodiment of the present invention.

Referring to FIG. 1, a display device according to the first exemplary embodiment of the present invention prevents an inside region of an OLED device from being exposed to external light and includes a display panel 140, a window 110 and a protection film 150.

According to the first exemplary embodiment of the present invention, the display panel 140 is a constituent element displaying images. The display panel 140 as described hereinafter is a display panel of an organic light emitting diode (OLED) display device including organic light emitting elements. However, it is not limited thereto, and the display panel may be a display device such as one of a liquid crystal display (LCD), a plasma display device (PDP), an electric field effect display device (FED), and an electrophoretic display.

Referring to FIG. 1, the display panel 140 generally includes a display substrate 143, an organic light emitting element 142 and a thin film encapsulation layer 141. A detailed description thereof will be given with reference to FIG. 2 and FIG. 3.

Figure 2:
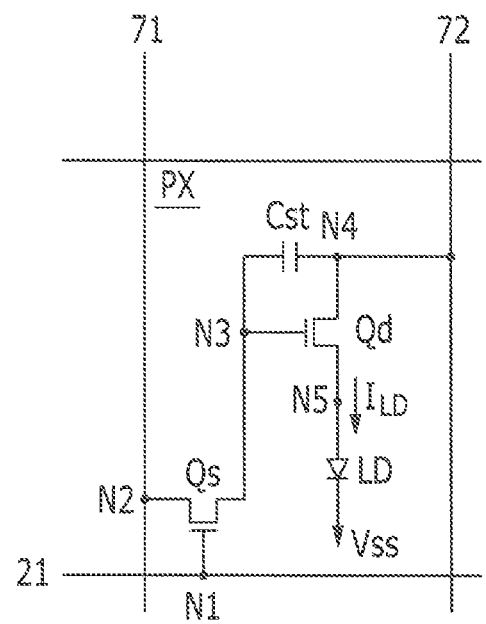
FIG. 2 shows an equivalent circuit of one pixel of the display panel shown in FIG. 1.
Figure 3:
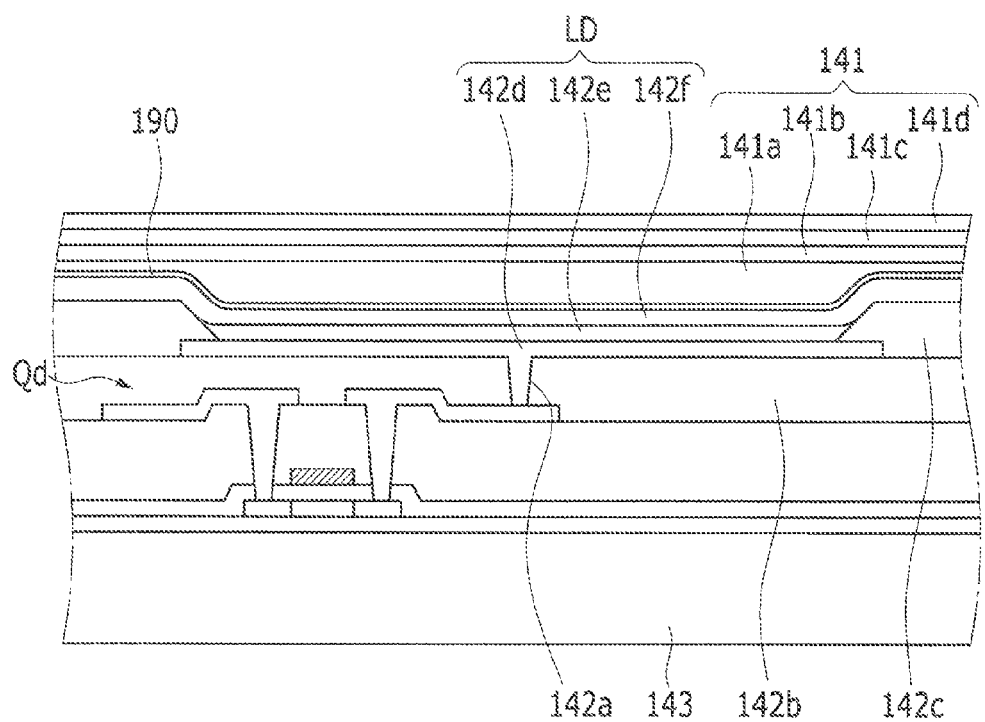
FIG. 3 is a cross-sectional view of the display panel shown in FIG. 1.

FIG. 2 is an equivalent circuit of one pixel of the display panel shown in FIG. 1, and FIG. 3 is a cross-sectional view of the display panel shown in FIG. 1.

Referring to FIG. 2, a display panel 140 includes a plurality of signal lines 21, 71, and 72 and a pixel PX connected thereto. The pixel PX may be one of a red pixel (R), a green pixel (G) and a blue pixel (B).

The signal lines include scanning signal lines 21 for transmitting gate signals (or scanning signals), data lines 71 for transmitting data signals, and driving voltage lines 72 for transmitting a driving voltage. The scanning signal lines 21 extend substantially in a row direction and substantially parallel to each other, and the data lines 71 extend substantially in a column direction and substantially parallel to each other. The driving voltage lines 72 extend substantially in a column direction and substantially parallel to each other, however they may extend in the row direction or the column direction, and may form a mesh shape.

One pixel PX includes a switching transistor Qs, a driving transistor Qd, a storage capacitor Cst, and an organic light emitting element LD.

The switching transistor Qs has a control terminal connected to a node N1, an input terminal connected to a node N2, and an output terminal connected to a node N3, and the control terminal connected to the node N1 is connected to the scanning signal line 21, the input terminal connected to the node N2 is connected to the data line 71, and the output terminal connected to the node N3 is connected to the driving transistor Qd. The switching transistor Qs transmits data signals applied to the data line 71 to the driving transistor Qd in response to a gate signal applied to the scanning signal line 21.

The driving transistor Qd includes a control terminal connected to the node N3, an input terminal connected to a node N4, and an output terminal connected to a node N5, and the control terminal connected to the node N3 is connected to the switching transistor Qs, the input terminal connected to the node N4 is connected to the driving voltage line 72, and the output terminal connected to the node N5 is connected to the organic light emitting element LD. The driving transistor Qd drives an output current ILD having a magnitude depending on the voltage between the control terminal N3 and the output terminal N5 thereof.

The capacitor Cst is connected between the control terminal connected to the node N3 and the input terminal connected to the node N4 of the driving transistor Qd. The capacitor Cst stores a data signal applied to the control terminal of the driving transistor Qd and maintains the data signal after the switching transistor Qs turns off.

The organic light emitting element LD as an organic light emitting diode (OLED) has an anode connected to the output terminal connected to the node N5 of the driving transistor Qd and a cathode connected to a common voltage Vss. The organic light emitting element LD emits light having an intensity depending on an output current ILD of the driving transistor Qd, thereby displaying images. The organic light emitting element LD may include an organic material uniquely emitting at least one of three primary colors of red, green, and blue, and the organic light emitting device displays desired images by a spatial sum thereof.

As the image and corresponding data inputs change and transistors Qs and Qd turn on and off, the connection relationships of the transistors Qs and Qd, the capacitor Cst, and the organic light emitting element LD may change.

Next, referring to FIG. 3, a cross-section of the general display panel 120 will be described. The cross-section of the display panel 120 of FIG. 3 shows the display panel 120 of FIG. 1 in detail.

Referring to FIG. 3, a driving transistor Qd is formed on a display substrate 143 made of transparent glass or plastic. Also, a plurality of signal lines (not shown) and a plurality of switching transistors (not shown) may be further formed on the display substrate 143. At this time, according to an exemplary embodiment of the present invention, the display substrate 143 may be a flexible substrate.

A protective layer 142b made of an inorganic material or an organic material is formed on the driving transistors Qd. When the protective layer 142b is made of the organic material, the surface thereof may be flat. The protective layer 142b has a contact hole 142a exposing a portion of the driving transistor Qd. A pixel electrode 142d is formed on the protective layer 142b. The pixel electrode 142d may include a reflective electrode and a transparent electrode formed thereon. The reflective electrode may be made of a metal having high reflectance, such as one of silver (Ag), aluminum (Al), an alloy thereof, and the like, and the transparent electrode may be made of a transparent conductive oxide such as one of ITO (indium tin oxide) and IZO (indium zinc oxide).

A pixel definition layer 142c covering a circumference of an edge of the pixel electrode 142d may be formed on the protective layer 142b.

An organic emission layer 142e may be formed on the pixel electrode 142d, and a common electrode 142f may be formed on the organic emission layer 142e and the pixel definition layer 142c.

The organic emission layer 142e may further include organic layers (not shown) for efficiently transferring carriers of holes or electrons to the emission layer in addition to an emission layer (not shown) that emits light. The organic layers may be a hole injection layer (HIL) and a hole transport layer (HTL), which may be positioned between the pixel electrode 142d and the emission layer, and an electron injection layer (EIL) and an electron transport layer (ETL), which may be positioned between the common electrode 142f and the emission layer.

A cover layer 190 covering the common electrode 142f to protect the common electrode 142f may be formed of the organic layer on the common electrode 142f.

A thin film encapsulation layer 141 is formed on the cover layer 190. The thin film encapsulation layer 141 seals and protects from outside elements the organic light emitting element LD and a driving circuit portion formed on the substrate 143.

The thin film encapsulation layer 141 may include organic encapsulation layers 141a and 141c and inorganic encapsulation layers 141b and 141d alternately laminated one by one. FIG. 3 shows a case where the two organic encapsulation layers 141a and 141c and two inorganic encapsulation layers 141b and 141d are alternately laminated one by one to constitute the thin film encapsulation layer 141 as an example, but the present invention is not limited thereto.

Referring to FIG. 1, a polarizing plate 130 is disposed on the display panel 140. The polarizing plate 130 polarizes light that is emitted from the display panel 140 and directed to the outside. In general, the polarizing plate has a structure in which a transparent protection film is deposited on both sides or one side of a polarizer made of a polyvinyl alcohol-based resin.

In detail, the polarizing plate 130 has a structure in which polyvinyl alcohol (PVA)-based molecular chains are arranged in a predetermined direction and a triacetyl cellulose (TAC) film as the protection film is adhered to the polarizer, which includes an iodine-based compound or a dichroic polarizer material. At this time, the polarizer and the protection film are adhered by an aqueous adhesive made of a polyvinyl alcohol-based solution.

However, the polarizing plate 130 is not limited thereto, and a polarizing plate of various structures may be used.

A resin layer 120 may be formed on the polarizing plate 130. The resin layer 120 may join the window 110 and the polarizing plate 130 while maintaining a separation distance between window 110 and polarizing plate 130. Resin layer 120 may be formed by hardening a liquid resin.

The window 110 may be disposed on the display panel 140. The window 110 has a function of protecting the display panel 140, which is positioned under the window 110.

The window 110 may be made of a transparent material so that a user may view the display unit from the front of the display panel 140, and for example, may be made of tempered glass or a polymer plastic such as a polycarbonate.

According to the first exemplary embodiment of the present invention, the protection film 150 is attached under the display panel 140. The protection film 150 may be positioned under the display panel 140 and thereby function to protect the display panel 140.

Also, the protection film 150 of the display device according to the first exemplary embodiment of the present invention has a function of reflecting natural light transmitted from the outside, for example, strong sunlight.

As described above, if the strong sunlight is transmitted inside the display device from the outside, the rear surface of the display panel 140 (surface facing protection film 150 in FIG. 1) in the assembled product may be entirely exposed to view. Accordingly, to prevent the inside of the display device from being exposed to view, the protection film 150 has the reflection function.

Referring to FIG. 4 to FIG. 7, the protection film 150 may include the first and second base layers and a metal layer.

Figure 4:
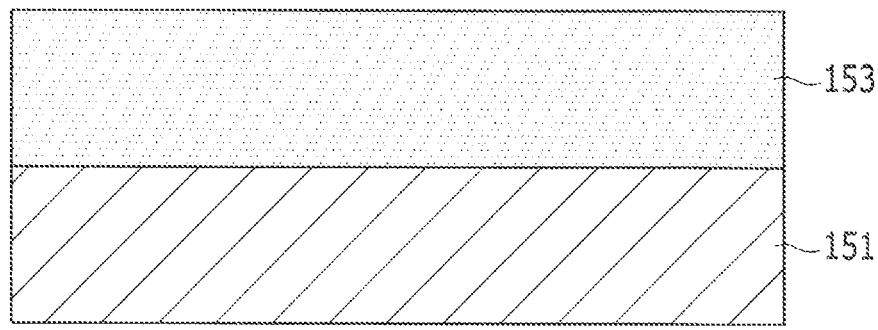
FIG. 4 is a cross-sectional view of the protection film shown in FIG. 1.

Referring to FIG. 4, the protection film 150 may include a first base layer 151 and a metal layer 153.

The first base layer 151 may be a film including a material selected from a group including poly(ethylene terephthalate) (PET), poly(ethylene naphthalate) (PEN), poly(ethylene sulfide) (PES), polyethylene (PE), urethane and polycarbonate. Other than the above, various kinds of films already known in the art may be used.

Also, the metal layer 153 is positioned on the first base layer 151. The metal layer 153 has a function of reflecting the light transmitted from the outside.

The metal layer 153 may be made of a metal sheet. However, it may alternatively be formed on the first base layer 151 by one of a vacuum deposition method, a chemical deposition method and a sputtering method. The vacuum deposition method, the chemical deposition method, and the sputtering method are methods known in the art to be used for the manufacture of display devices, and detailed descriptions are omitted.

The metal layer 153 may be made of one of aluminum, silver, chromium, and molybdenum. However, the metal constituting the metal layer is not limited thereto, and various metals that reflect light may be used for the metal layer 153.

Figure 5:
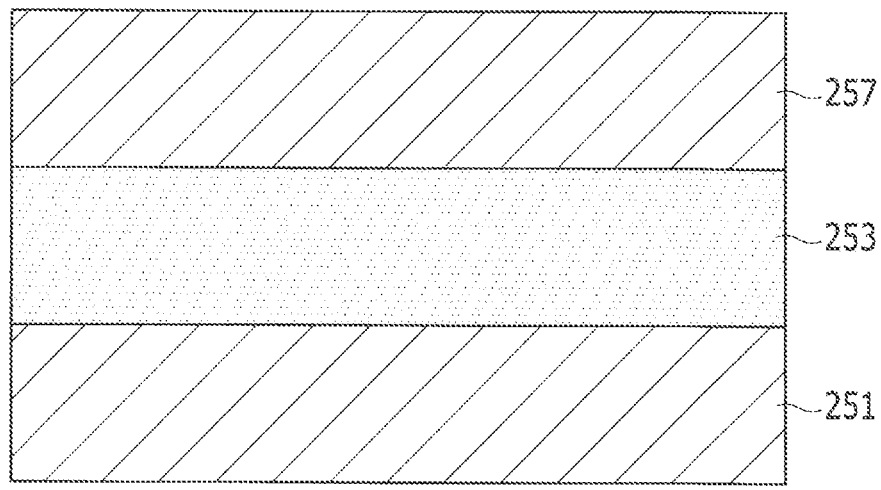
FIG. 5 is a cross-sectional view of a protection film according to the second exemplary embodiment.

According to the second exemplary embodiment, as shown in FIG. 5, the protection film 150 of the display device may further include a second base layer 257 formed on a metal layer 253.

The second base layer 257 may be formed from one of the materials described above in connection with first base layer 151. However, second base layer 257 may be formed of a material selected from a group including poly(ethylene terephthalate) (PET), poly(ethylene naphthalate) (PEN), poly(ethylene sulfide) (PES), polyethylene (PE), urethane, and polycarbonate, the material selected for second base layer 257 being different from the material selected for first base layer 251.

The protection film may further include an adhesion layer (not shown) interposed between the metal layer and at least one base layer.

Figure 6:
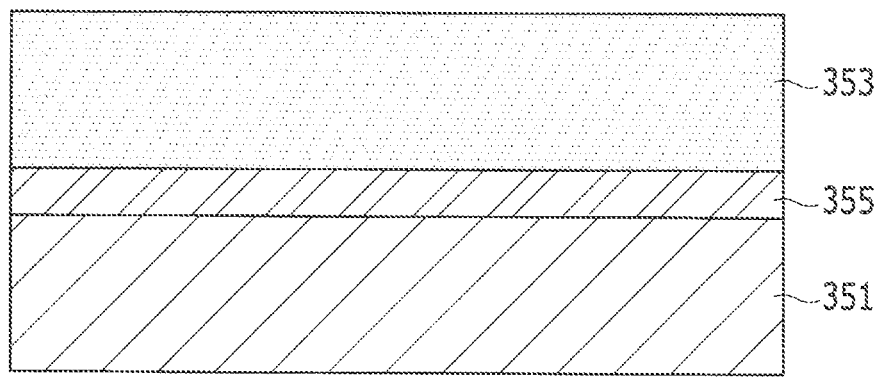
FIG. 6 is a cross-sectional view of a protection film according to the third exemplary embodiment.

Referring to FIG. 6, a display device according to the third exemplary embodiment of the present invention includes a protection film 150 that further includes a first adhesion layer 355 formed between a first base layer 351 and a metal layer 353.

The first adhesion layer 355 has adhesion force adhering the metal layer 353 and the first base layer 351 to each other. The first adhesion layer 355 may be a strong adhesion film of an acryl-based material.

A thickness of the first adhesion layer 355 may be in a range of 4 μm-5 μm. However, the thickness of the adhesion layer is not limited thereto, and it may be changed according to the size of the display panel.

Figure 7:
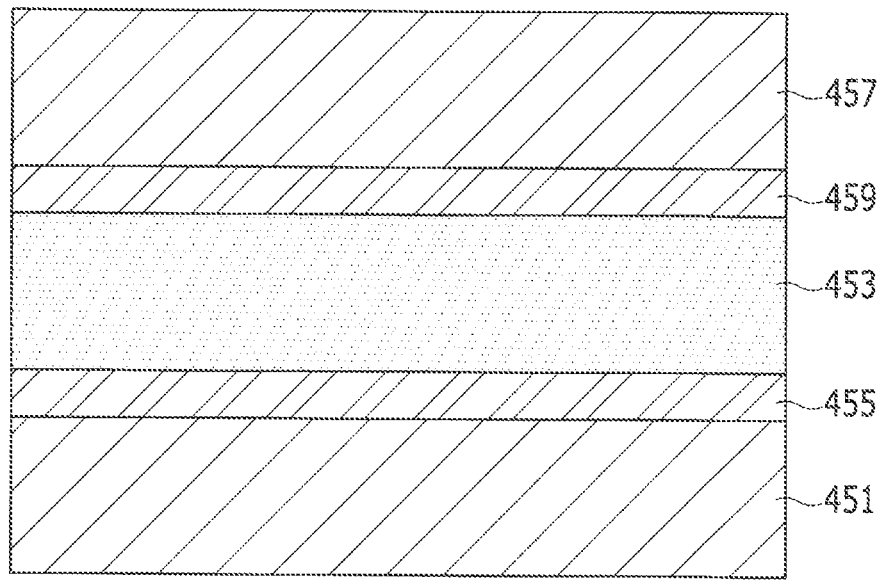
FIG. 7 is a cross-sectional view of a protection film according to the fourth exemplary embodiment.

Referring to FIG. 7, a protection film of a display device according to the fourth exemplary embodiment of the present invention may be formed by sequentially depositing a first base layer 451, a first adhesion layer 455, a metal layer 453, a second adhesion layer 459, and a second base layer 457 onto the side of display substrate 143 opposite to emitting element 142. However, the first and second adhesion layers may be both formed within the protection film, or only one of the two may be formed.

The second adhesion layer 459 may be formed of the same material as the first adhesion layer 355 (referring to FIG. 6) of the third exemplary embodiment.

The protection film has the function of reflecting the light transmitted from the outside, and the reflectivity of the protection film according to an exemplary embodiment of the present invention may be in a range of from about 6% to about 10%. However, the reflectivity is not limited thereto, and it may have values outside of this range according to the size and the thickness of the display device.

Also, according to an exemplary embodiment of the present invention, phototransmittance of the protection film may be in a range of from about 50% to about 80%, and, as with the reflectivity, the phototransmittance may also have values outside of this range according to the size and the thickness of the display device.

Referring to FIG. 1, a FPCB 160 transmitting a driving signal may be attached under the protection film 150.

Here, if the protection film does not have the reflection function, a lower portion of the display substrate may be entirely exposed to view such that an adhesion state of the FPCB with the display panel (for example, wrinkled the FPCB) is revealed.

However, the protection film 150, having the reflection function, reflects light transmitted from the outside, thereby preventing an exposure of an adhesion state of the FPCB with the display panel.

Next, a manufacturing method of a display device according to another exemplary embodiment of the present invention will be described.

Firstly, the manufacturing method of the display device according to another exemplary embodiment of the present invention may start with a step of forming the display panel 140 (referring to FIG. 1).

The display panel 140 includes, as described above, a display substrate 143, an organic light emitting element 142 formed on the display substrate, and a thin film encapsulation layer 141 covering the organic light emitting element 142.

When forming the display panel 140, the organic light emitting element 142 and the thin film encapsulation layer 141 are sequentially deposited on the display substrate 143.

Next, a window 110 protecting the display panel 140 is attached on the display panel 140. Before attaching the window 110 on the display panel 140, the above-described polarizing plate 130 is positioned on the display panel 140, and the window 110 may be attached to the display panel 140 by the resin layer 120, which is formed on the polarizing plate 130.

Next, a protection film 150 is attached under the display panel 140. At this time, the metal layer or the second base layer that is shown in upper portions of FIGS. 4-7 is attached to a surface of the display substrate 143 that is opposite to the surface of substrate 143 that is adjacent to organic light emitting element 142.

However, the step of attaching the protection film 150 under the display panel 140 and the step of attaching the window 110 on the display panel 140 may be performed sequentially in either order.

The display device according to an exemplary embodiment of the present invention includes the protection film reflecting the light transmitted from the outside, thereby preventing the inside of the display device from being exposed to view. Also, the manufacturing method of the display device according to another exemplary embodiment of the present invention may manufacture the display device including the protection film having a reflection function.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

DESCRIPTION OF SYMBOLS

| | |
|---|---|
| 21: scan signal line | 71: data line |
| 72: driving voltage line | 110: window |
| 120: resin layer | 130: polarizing plate |
| 140: display panel | 141: thin film encapsulation layer |
| 142: organic light emitting element | 143: display substrate |
| 150: protection film | |

What is claimed is:

1. A display device comprising:
a display panel displaying an image;
a window positioned on the display panel and protecting the display panel; and
a protection film attached under the display panel and reflecting light transmitted from the outside, reflectivity of the protection film being in a range of from about 6% to about 10%.

2. The display device of claim 1,
the protection film comprising:
a first base layer; and
a metal layer positioned on the first base layer.

3. The display device of claim 2,
the metal layer including one of aluminum, silver, chromium, and molybdenum.

4. The display device of claim 3,
the first base layer including one of polyethylene terephthalate, polyethylene naphthalate, polyethylene sulfide, polyethylene, urethane, and polycarbonate.

5. The display device of claim 4, further comprising
a second base layer formed on the metal layer.

6. The display device of claim 5, further comprising
at least one adhesion layer formed between the metal layer and at least one of the first base layer and the second base layer.

7. The display device of claim 6,
a thickness of the at least one adhesion layer being in a range of from about 4 μm to about 5 μm.

8. The display device of claim 1,
phototransmittance of the protection film being in a range of from about 50% to about 80%.

9. A method of manufacturing a display device, comprising:
forming a display panel including a display substrate, an organic light emitting element formed on the display substrate, and a thin film encapsulation layer covering the organic light emitting element;
attaching a window protecting the display panel on the display panel; and
attaching a protection film reflecting light transmitted from the outside under the display panel, reflectivity of the protection film being in a range of from about 6% to about 10%.

10. The method of claim 9,
the protection film comprising:
a first base layer; and
a metal layer positioned on the first base layer.

11. The method of claim 10,
the metal layer being formed by depositing a metal on the first base layer.

12. The method of claim 11,
the metal layer being formed of one of aluminum, silver, chromium, and molybdenum.

\* \* \* \* \*